United States Patent
Choi et al.

(10) Patent No.: US 8,748,931 B2
(45) Date of Patent: Jun. 10, 2014

(54) ORGANIC LIGHT EMITTING DISPLAY APPARATUS INCLUDING A FILLER AND METHOD OF MANUFACTURING THE SAME

(75) Inventors: Young-Seo Choi, Suwon-si (KR);
Kwan-Hee Lee, Suwon-si (KR);
Seung-Yong Song, Suwon-si (KR);
Oh-June Kwon, Suwon-si (KR);
Sun-Young Jung, Suwon-si (KR);
Ji-Hun Ryu, Suwon-si (KR);
Young-Cheol Joo, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 704 days.

(21) Appl. No.: 12/406,783

(22) Filed: Mar. 18, 2009

(65) Prior Publication Data
US 2010/0012966 A1    Jan. 21, 2010

(30) Foreign Application Priority Data

Jul. 17, 2008 (KR) .................. 10-2008-0069743

(51) Int. Cl.
*H01L 33/00* (2010.01)

(52) U.S. Cl.
USPC .................. 257/100; 257/687; 257/E33.059

(58) Field of Classification Search
USPC .............. 257/E21.502, E33.056, E33.058, 257/E33.059, 99, E23.135–E23.137, 100, 257/687

See application file for complete search history.

(56) References Cited

U.S. PATENT DOCUMENTS

| | | | |
|---|---|---|---|
| 2003/0071570 A1 | 4/2003 | Tamashiro et al. | |
| 2003/0122476 A1* | 7/2003 | Wang et al. | 313/493 |
| 2007/0090759 A1 | 4/2007 | Choi et al. | |
| 2007/0172971 A1 | 7/2007 | Boroson | |
| 2008/0018231 A1 | 1/2008 | Hirakata | |
| 2008/0296606 A1* | 12/2008 | Ottobon et al. | 257/100 |

FOREIGN PATENT DOCUMENTS

| | | |
|---|---|---|
| JP | 2000-030858 (A) | 1/2000 |
| JP | 2003-109750 (A) | 4/2003 |
| JP | 2003-178866 (A) | 6/2003 |
| JP | 2003-197366 (A) | 7/2003 |
| JP | 2003-203763 (A) | 7/2003 |
| JP | 2005-332615 (A) | 12/2005 |
| JP | 2006-004721 (A) | 1/2006 |
| JP | 2007-115692 (A) | 5/2007 |
| JP | 2007-157343 (A) | 6/2007 |
| JP | 2007-265987 (A) | 10/2007 |

\* cited by examiner

*Primary Examiner* — Laura Menz
*Assistant Examiner* — Candice Y Chan
(74) *Attorney, Agent, or Firm* — Knobbe, Martens Olson & Bear, LLP

(57) ABSTRACT

An organic light emitting display apparatus and a method of manufacturing the organic light emitting display apparatus are disclosed. In one embodiment, the organic light emitting display apparatus includes: i) a substrate, ii) a display unit formed on the substrate, iii) an encapsulation substrate formed over the display unit, iv) a sealant bonding the substrate and the encapsulation substrate and v) a filler formed in the space defined by i) the substrate, ii) the sealant and iii) the encapsulation substrate, wherein the filler comprises a first region and a second region which have different levels of hardness.

13 Claims, 4 Drawing Sheets

ORGANIC LIGHT EMITTING DISPLAY APPARATUS INCLUDING A FILLER AND METHOD OF MANUFACTURING THE SAME

CROSS-REFERENCE TO RELATED PATENT APPLICATION

This application claims the benefit of Korean Patent Application No. 10-2008-0069743, filed on Jul. 17, 2008 in the Korean Intellectual Property Office, the disclosure of which is incorporated herein in its entirety by reference.

BACKGROUND OF THE INVENTION

1. Field of the Invention

The present invention relates to an organic light emitting apparatus and a method of manufacturing the same, and more particularly, to an organic light emitting display apparatus which prevents penetration of external impurities such as oxygen or water, and a method of manufacturing the organic light emitting display apparatus.

2. Description of the Related Technology

Recently, conventional display devices are being replaced with portable, thin flat panel display devices. Among the flat panel display devices, an electroluminescent display device, which is a self-emissive display device, has a wide viewing angle, high contrast ratio, and high response speed, and thus has been considered to be the next-generation display device. In addition, an organic light-emitting display device having a light emitting layer formed of an organic material has improved properties in terms of brightness, driving voltage, and response speed, and can realize multiple colors in comparison to an inorganic light emitting display device.

SUMMARY OF CERTAIN INVENTIVE ASPECTS

One aspect of the present invention is an organic light emitting display apparatus including a filler between a substrate and an encapsulation substrate, wherein the filler is hardened differentially to prevent pollution of a sealant and reduce exfoliation defects, and a method of manufacturing the organic light emitting display apparatus.

Another aspect of the present invention is an organic light emitting display apparatus comprising: a substrate; a display unit formed on the substrate; an encapsulation substrate formed above the display unit; a sealant bonding the substrate and the encapsulation substrate; and a filler formed between the substrate and the encapsulation substrate, wherein the filler includes a first region and a second region which are hardened differentially.

The second region of the filler may be adjacent to the sealant, and the first region may be inside the second region.

The first region may be a center portion of the filler, and the second region may be a boundary portion of the filler.

The second region may be hardened more than the first region.

The filler may fill a space between the substrate and the encapsulation substrate.

The filler may cover the display unit.

Another aspect of the present invention is an organic light emitting display apparatus comprising: a substrate; a display unit formed on the substrate; an encapsulation substrate formed above the display unit; a sealant bonding the substrate and the encapsulation substrate; a first filler formed interior to the sealant and to be adjacent to the sealant; and a second filler formed interior to the first filler and hardened less than the first filler.

Another aspect of the present invention is a method of manufacturing an organic light emitting display apparatus, the method comprising: forming a display unit on a surface of a substrate; preparing an encapsulation substrate; forming a sealant on the surface of the substrate; filling a filler interior to the sealant of the substrate; disposing the encapsulation substrate above the substrate; hardening the filler differentially; and bonding the substrate and the encapsulation substrate using the sealant.

In the hardening of the filler differentially, a center portion and a boundary portion of the filler may be hardened differentially.

The boundary portion of the filler may be hardened more than the center portion of the filler.

The hardening of the filler differentially may be performed using a ultra violet (UV) mask having different UV transmittivities in a center portion and a boundary portion of the UV mask.

The UV transmittivity of the boundary portion of the UV mask may be higher than the UV transmittivity of the center portion of the UV mask.

The method may further comprise completely hardening the filler after bonding the substrate and the encapsulation substrate using the sealant.

In the filling of a filler, the filler may be filled in a space between the substrate and the encapsulation substrate. In the filling of a filler, the filler may be filled to cover the display unit.

Another aspect of the invention is an organic light emitting display apparatus comprising: a substrate comprising at least two opposing edges; a display unit formed on the substrate and between the at least two opposing edges of the substrate; an encapsulation substrate formed over the display unit; a sealant bonding the substrate and the encapsulation substrate, wherein the sealant comprises at least two sub-sealants formed adjacent to the at least two opposing edges of the substrate; and a filler formed in the space defined by i) the substrate, ii) the sealant and iii) the encapsulation substrate, wherein the filler comprises a first region and a second region which have different levels of hardness.

In the above apparatus, the second region comprises at least two sub-regions, and wherein the first region is located between the at least two sub-regions of the second region so that the second region of the filler is closer to the sub-sealants than the first region. In the above apparatus, the first region is a center portion of the filler, and the second region is a boundary portion of the filler. In the above apparatus, the second region has a greater level of hardness than that of the first region. In the above apparatus, the filler at least partially fills a space between the substrate and the encapsulation substrate. In the above apparatus, the filler covers the display unit. In the above apparatus, the first region comprises at least two opposing sides, and wherein the second region extends from the at least two opposing sides toward the at least two sub-sealants.

In the above apparatus, the filler contacts at least two of i) the substrate, ii) the display unit and iii) the encapsulation substrate. In the above apparatus, the first region is formed of a material having a first viscosity, and wherein the second region is formed of a material having a second viscosity which is greater than the first viscosity. In the above apparatus, the first region contacts the display unit, and wherein the second region does not contact the display unit. In the above apparatus, a gap is formed between the filler and the sealant.

Another aspect of the invention is an organic light emitting display apparatus comprising: a substrate; a display unit formed on the substrate; an encapsulation substrate formed above the display unit; a sealant bonding the substrate and the encapsulation substrate; a first filler covering the display unit, wherein the first filler has a first viscosity; and a second filler having a second viscosity which is greater than the first viscosity, wherein the second filler does not contact the display unit, and wherein the second filler is closer to the sealant than the first filler.

Another aspect of the invention is a method of manufacturing an organic light emitting display apparatus, the method comprising: forming a display unit on a surface of a substrate, wherein the substrate comprises at least two opposing edges; preparing an encapsulation substrate; forming first and second sealants on the surface of the substrate and adjacent to the at least two opposing edges; providing a filler between the first and second sealants and on the substrate; disposing the encapsulation substrate above the substrate; hardening portions of the filler differentially; and bonding the substrate and the encapsulation substrate via the first and second sealants.

In the above method, the filler comprises i) a first portion having at least two opposing sides and ii) a second portion, and wherein the second portion extends from the at least two opposing sides toward the first and second sealants. In the above method, the second portion of the filler is hardened more than the first portion of the filler. In the above method, the hardening comprises: providing an ultra violet (UV) mask having different UV transmittivities over the encapsulation substrate such that the UV mask is aligned with the filler; and applying UV radiation toward the filler via the UV mask.

In the above method, the UV transmittivity of the portion of the UV mask which is aligned with the second portion of the filler is higher than the UV transmittivity of the portion of the UV mask which is aligned with the first portion of the filler. The above method further comprises completely hardening the filler after bonding the substrate and the encapsulation substrate via the sealants. In the above method, the filler contacts at least two of i) the substrate, ii) the display unit and iii) the encapsulation substrate. In the above method, the filler covers the display unit.

DETAILED DESCRIPTION OF CERTAIN INVENTIVE EMBODIMENTS

Figure 1:
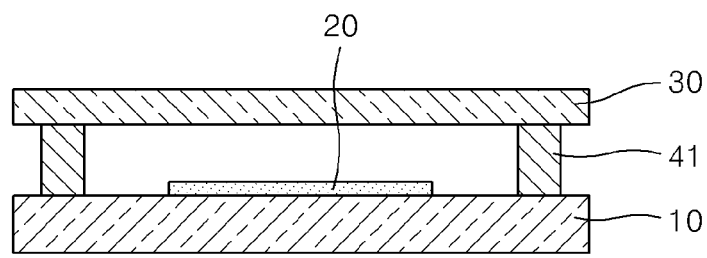
FIG. 1 is a cross-sectional view illustrating an organic light emitting display apparatus.

FIG. 1 is a cross-sectional view of an organic light emitting display apparatus. Referring to FIG. 1, a display unit 20 is formed on a substrate 10, and an encapsulation substrate 30 is formed above the display unit 20 and the substrate 10 and the encapsulation substrate 30 are attached to each other using a sealant 41.

A flat panel display unit included in a flat panel display device, particularly, an organic light emitting diode, may deteriorate because of internal factors such as deterioration of a light emitting layer due to oxygen in indium tin oxide (ITO) used for forming an electrode or a reaction between the light emitting layer and an interface, and also because of external factors such as water, oxygen, ultraviolet radiation reaching the unit from the outside, and the manufacturing conditions of the device. Particularly, oxygen and water affect the life span of the flat panel display device, and thus packaging of the organic light emitting diode is critical.

In the FIG. 1 organic light-emitting display apparatus, impurities such as oxygen or water from the outside may penetrate into the organic light-emitting display apparatus through the interface between the sealant 41 and the encapsulation substrate 30 and thus damage the display unit 20. Also, since after sealing only an outer portion of the encapsulation substrate 30 contacts the sealant 41, an external shock is concentrated on the sealant 41, and thus exfoliation or breakage of cells of the organic light emitting diode is generated.

In order to solve this problem, a method of further forming a filler (not shown) between the substrate 10 and the encapsulation substrate 30 has been developed.

However, when the filler is made of a material having high viscosity, it is difficult to fill the filler in uneven portions of the organic light emitting diode of the display unit 20. In contrast, when the filler is made of a material having small viscosity, the filler is quickly distributed under high vacuum conditions in the sealant 41, thereby generating exfoliation detects.

Embodiments of the present invention will now be described more fully with reference to the accompanying drawings, in which exemplary embodiments of the invention are shown.

Figure 2:
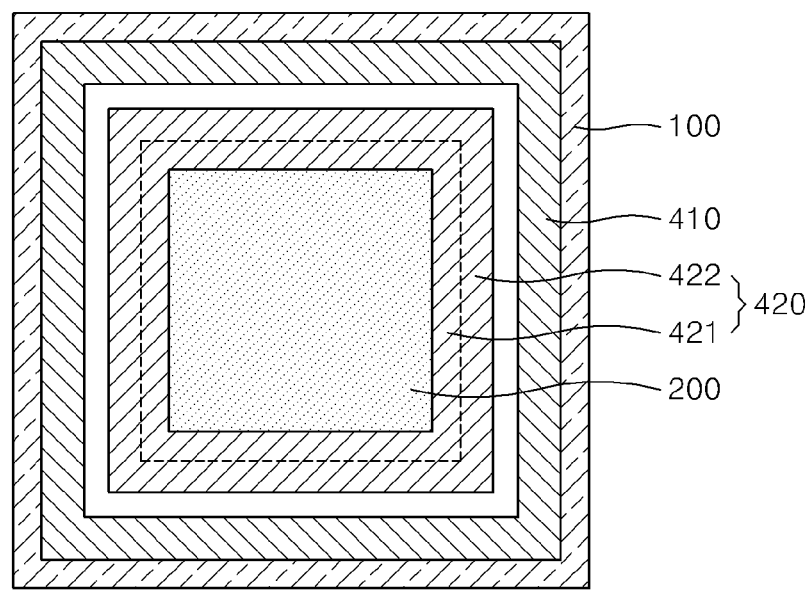
FIG. 2 is a plan view illustrating a portion of an organic light emitting display apparatus according to an embodiment of the present invention.
Figure 3:
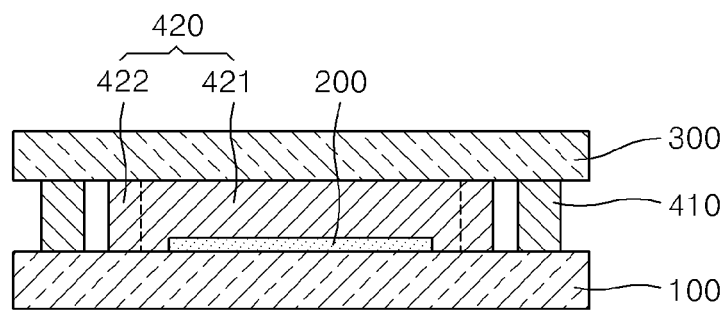
FIG. 3 is a cross-sectional view illustrating the organic light emitting display apparatus of FIG. 2.

FIG. 2 is a plan view illustrating a portion of an organic light emitting display apparatus according to an embodiment of the present invention, and FIG. 3 is a cross-sectional view illustrating the organic light emitting display apparatus of FIG. 2. In FIG. 2, an encapsulation substrate 300 illustrated in FIG. 3 is not shown.

Referring to FIGS. 2 and 3, a display unit 200 including a plurality of organic light emitting diodes is formed on a substrate 100.

The substrate 100 may be formed of transparent glass containing $SiO_2$ as a main component, but is not limited thereto, and thus may also be formed of a transparent plastic material that may be an insulating organic material selected from the group consisting of polyethersulphone (PES), polyacrylate (PAR), polyetherimide (PEI), polyethyelene napthalate (PEN), polyethyelene terephthalate (PET), polyphenylene sulfide (PPS), polyallylate, polyimide, polycarbonate (PC), triacetate cellulose (TAC), and cellulose acetate propionate (CAP).

In a bottom emission type organic light-emitting display apparatus in which an image is realized toward the substrate 100, the substrate 100 may be formed of a transparent material. However, in a top emission type organic light-emitting display apparatus in which an image is realized away from the substrate 100, the substrate 100 may not be necessarily formed of a transparent material, and, in this case, the substrate 100 may be formed of a metal. When the substrate 100 is formed of a metal, the substrate 100 may include at least one material selected from the group consisting of carbon, iron, chromium, manganese, nickel, titanium, molybdenum, stainless steel (SUS), Invar alloys, Inconel alloys, and Kovar alloys, but is not limited thereto. Thus, the substrate 100 may also be formed of a metal foil.

Although not illustrated in the drawings, a buffer layer may be further formed on a top surface of the substrate 100 to planarize the substrate 100 and prevent penetration of impurities into the bottom emission type organic light-emitting display apparatus.

The substrate 100, including the display unit 200, is attached to an encapsulation substrate 300 that is disposed above the display unit 200. The encapsulation substrate 300 may also be formed not only of a glass material but also of various plastic materials such as acryl, and furthermore, a metal.

The substrate 100 and the encapsulation substrate 300 are attached to each other using a sealant 410. The sealant 410 may be a sealing glass frit, as generally used in the art.

In one embodiment, a filler 420 is formed interior to the sealant 410, that is, the filler 420 is at least partially filled in a space between the substrate 100 and the encapsulation substrate 300. The filler 420 may contact at least two of i) the substrate 100, ii) the display unit 200 and iii) the encapsulation substrate 300.

As described above, in the FIG. 1 organic light emitting display apparatus, impurities such as oxygen or water from the outside may penetrate into the organic light emitting display apparatus through a sealant that attaches a substrate and an encapsulation substrate and damage the display unit. Also, since only an outer portion of the encapsulation substrate that is sealed contacts the sealant, am external shock is concentrated on the sealant and thus exfoliation or cell breakage is generated. In order to solve this problem, a method of further forming a filler between a substrate and an encapsulation substrate has been developed. However, when the filler is formed of a material having great viscosity, it is not easy to fill the filler in uneven portions of an organic light emitting diode of the display unit, and on the contrary, when the filler is formed of a material having small viscosity, the filler is quickly distributed under high vacuum conditions and thus pollutes the sealant.

To solve this problem, according to one embodiment of the present invention, the filler 420 is differentially hardened, that is, a boundary portion of the filler 420 is hardened more than a center portion of the filler 420, so that the boundary portion of the filler 420 functions as a dam.

In one embodiment, as illustrated in FIG. 2 and 3, the filler 420 that filled in the space between the substrate 100 and the encapsulation substrate 300 includes a first region 421 and a second region 422. The first region 421 denotes the center portion of the filler 420 and the second region 422 denotes the boundary portion of the filler 420, that is, a region outside the first region 421 and adjacent to the sealant 410.

In one embodiment, the filler 420 filled in the space between the substrate 100 and the encapsulation substrate 300 is differentially hardened using an ultra violet (UV) mask having different UV transmittivities for a center portion and a boundary portion. The UV transmittivity of the boundary portion of the UV mask is higher than that of the center portion of the UV mask. Accordingly, the second region 422 of the filler 420 corresponding to the boundary portion of the UV mask having great UV transmittivity is hardened more than the first region 421 of the filler 420 corresponding to the center portion of the UV mask having low UV transmittivity. The differential hardening of the filler 420 will be described more in detail with reference to FIG. 5.

By differentially hardening the filler 420 such that the second region 422 in the boundary portion is hardened more than the first region 421 of the center portion of the filler 420, the second region 422 functions as a dam for separating the sealant 410 and the filler 420. In this embodiment, the second region 422 has a higher level of hardness than that of the first region 421. In another embodiment, the first region 421 is formed of a material having a first viscosity and the second region 422 is formed of a material having a second viscosity which is greater than the first viscosity. Accordingly, pollution of the sealant 410 by the filler 420 can be prevented and exfoliation defects can be reduced or prevented.

The filler 420 may be formed of an organic material, an inorganic material, an organic/inorganic hybrid material, and a mixture thereof.

The organic material may be at least one material selected from the group consisting of acrylic resin, methacrylic resin, polyisoprene, vinylic resin, epoxy resin, urethane resin, and cellulose resin. Examples of the acrylic resin include butylacrylate, ethylhexyl acrylate, etc. Examples of the methacrylic resin include propylene glycol methacrylate, tetrahydropyran-free methacrylate, etc. Examples of the vinylic resin include vinyl acetate, N-vinyl pyrrolidone. Examples of the epoxy resin include cycloaliphatic epoxide. Examples of the urethane resin include urethane acrylates. Examples of the cellulose resin include cellulose nitrate.

Examples of the inorganic material include metals such as silicon, aluminium, titanium, zirconium, and non-metals such as metal oxides, at least one material selected from the group consisting of titania, silicon oxide, zirconia, and alumina.

An organic/inorganic hybrid binder is a material in which a non-metal or metal such as silicon, aluminium, titanium, zirconium, etc., is covalently bonded to an organic material. The organic/inorganic hybrid binder may be at least one material selected from the group consisting of epoxy silane and its derivative, a vinyl silane and its derivative, amine silane and its derivative, methacrylate silane, and a resultant material of a partial hardening reaction of these. Examples of the epoxy silane and its derivative include 3-glycidoxypropyltrimethoxysilane and its polymer. Examples of the vinyl silane and its derivative include vinyltriethoxysilane and its polymer. Also, examples of the amine silane and its derivative include 3-aminopropyltriethoxysilane and its polymer. Examples of the methacrylate silane and its derivative include 3-(trimethoxysilyl)propyl acrylate and its polymer.

Thus, according to one embodiment of the present invention, by differentially hardening the filler 420, pollution of the sealant 410 can be prevented and exfoliation defects can be reduced or prevented.

Figure 4:
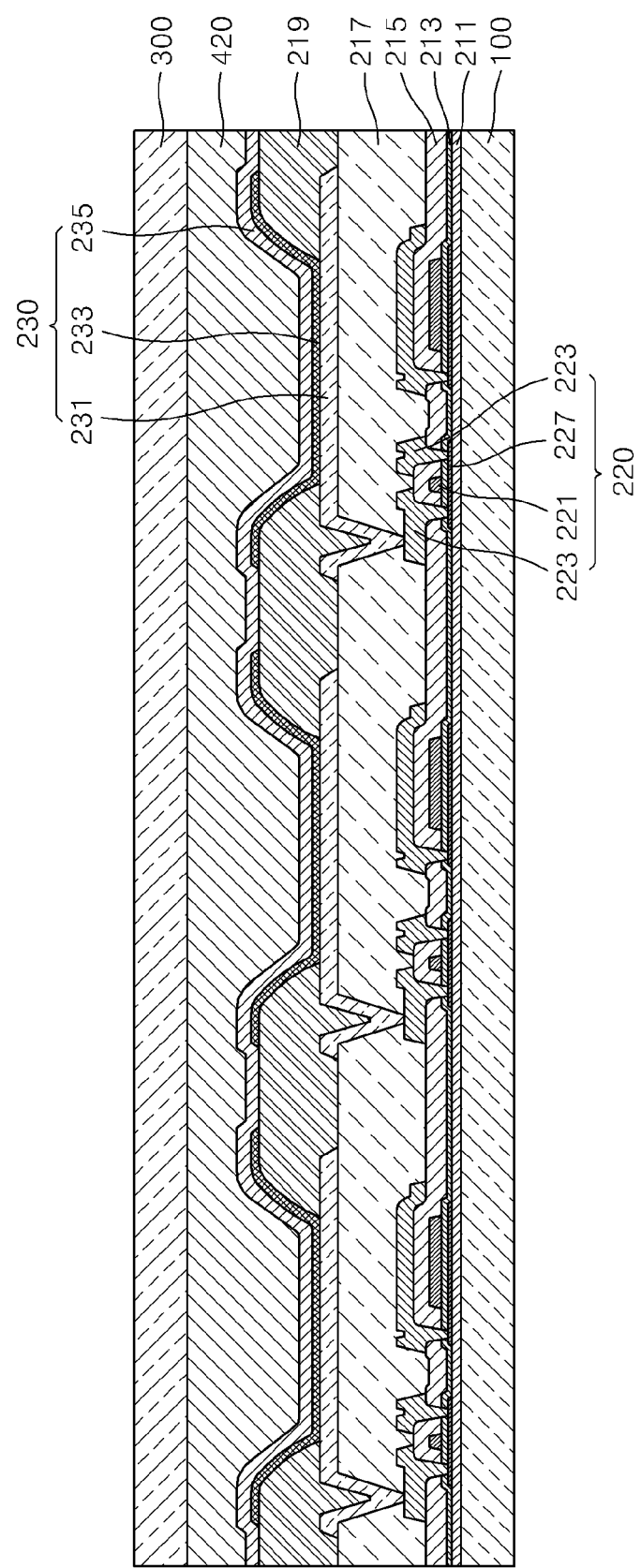
FIG. 4 is a cross-sectional view illustrating a portion of the organic light emitting display apparatus of FIG. 2.

FIG. 4 is a cross-sectional view illustrating a portion of the organic light emitting display apparatus of FIG. 2 according to one embodiment.

Referring to FIG. 4, a plurality of thin film transistors 220 are formed on the substrate 100, and an organic light emitting diode 230 is formed on each of the thin film transistors 220. The organic light emitting diode 230 includes a pixel electrode 231 electrically connected to the thin film transistor 220, a counter electrode 235 disposed overall on the substrate 100, and an intermediate layer 233 disposed between the pixel electrode 231 and the counter electrode 235 and including at least a light emitting layer.

The thin film transistors 220, each including a gate electrode 221, source and drain electrodes 223, a semiconductor layer 227, a gate insulating layer 213, and an interlayer insulating layer 215, are formed on the substrate 100. Obviously, the present embodiment is not limited to the thin film transistors 220, and other various thin film transistors such as an organic thin film transistor including a semiconductor layer formed of an organic material or a silicon thin film transistor formed of silicon may also be used. A buffer layer 211 formed of a silicon oxide or a silicon nitride may be further formed between the thin film transistors 220 and the substrate 100 according to necessity.

The organic light emitting diode 230 comprises a pixel electrode 231 and a counter electrode 235 facing each other, and an intermediate layer 233 formed of an organic material and interposed therebetween. The intermediate layer 233, including at least a light emitting layer, may also include a plurality of layers as will be described later.

The pixel electrode 231 functions as an anode and the counter electrode 235 functions as a cathode electrode, or vice versa.

The pixel electrode 231 may be formed as a transparent electrode or a reflective electrode. When formed as a transparent electrode, the pixel electrode 231 may be formed of indium tin oxide (ITO), indium zinc oxide (IZO), ZnO, or $In_2O_3$. When formed as a reflective electrode, the pixel electrode 231 may include a reflection layer formed of Ag, Mg, Al, Pt, Pd, Au, Ni, Nd, Ir, Cr or a compound of any of these, and a layer, formed of ITO, IZO, ZnO, or $In_2O_3$, formed on the reflection layer.

The counter electrode 235 may also be formed as a transparent electrode or a reflective electrode. When formed as a transparent electrode, the counter electrode 235 may include a layer in which Li, Ca, LiF/Ca, LiF/Al, Al, Mg, or a compound of any of these is deposited toward the intermediate layer 233 between the pixel electrode 231 and the counter electrode 235, and may also include a bus electrode line or an auxiliary electrode formed of ITO, IZO, ZnO, or $In_2O_3$. When formed as a reflective electrode, the counter electrode 235 may be formed by depositing Li, Ca, LiF/Ca, LiF/Al, Al, Mg or a compound of any of these.

Also, a pixel defining layer (PDL) 219 is formed to cover the edge of the pixel electrode 231 and to have a predetermined thickness away from the pixel electrode 231. Besides the function of defining a light emitting region, in the edge portion of the PDL 219, the counter electrode 235 is spaced apart from the pixel electrode 231 by a distance corresponding to the thickness of the PDL 219 located therebetween. Accordingly, concentration of an electric field on the edge portion of the pixel electrode 231 is prevented, thereby preventing a short circuit between the pixel electrode 231 and the counter electrode 235.

A plurality of intermediate layers 233 including at least a light emitting layer may be formed between the pixel electrode 231 and the counter electrode 235. In one embodiment, the intermediate layer 233 may be formed of a small molecule organic material or a polymer organic material.

When formed of a small molecule organic material, the intermediate layer 233 may have a single-layer or multiple-layer structure in which a hole injection layer (HIL), a hole transport layer (HTL), an organic light emission layer (EML), an electron transport layer (ETL), and an electron injection layer (EIL) are stacked. Examples of the organic material include copper phthalocyanine (CuPc), N,N'-Di(naphthalene-1-yl)-N,N'-diphenyl-benzidine (NPB), tris-8-hydroxyquinoline aluminum (Alq3), etc. The small molecule organic material may be formed using a vacuum deposition method using masks.

When formed of a polymer organic material, the intermediate layer 233 may mostly have a structure formed of an HTL and an EML; wherein the HTL may be formed of poly(3,4-ethylenedioxythiophene) (PEDOT), and the EML may be formed of poly-phenylenevinylene (PPV) and polyfluorene.

The organic light emitting diode 230 is electrically connected to the thin film transistor 220 disposed therebelow. When a planarization layer 217 covering the thin film transistor 220 is formed, the organic light emitting diode 230 is disposed on the planarization layer 217, and the pixel electrode 231 of the organic light emitting device 230 is electrically connected to the thin film transistor 220 via contact holes formed in the planarization layer 217.

Also, the organic light emitting diode 230 formed on the substrate 100 is sealed by the encapsulation substrate 300. The encapsulation substrate 300 may be formed of various materials such as glass or plastic, as described above.

Also, the filler 420 is injected between the organic light emitting device 230 and the encapsulation substrate 300 to fill a space therebetween, thereby preventing exfoliation or breakage of cells of the organic light emitting diode 230.

In one embodiment, the sealant 410 is formed along the boundary of the encapsulation substrate 300 or to cover the display unit 200, and the filler 420 is disposed interior to the sealant 410. The filler 420 is differentially hardened in its center portion and boundary portion; that is, the boundary portion is hardened more than the center portion, and thus pollution of the sealant 410 is prevented and exfoliation defects can be reduced or prevented accordingly.

FIGS. 5A through 5F are cross-sectional views sequentially illustrating a method of manufacturing an organic light emitting display apparatus according to an embodiment of the present invention.

Referring to FIGS. 5A through 5F, the method of manufacturing an organic light emitting display apparatus according to an embodiment of the present invention includes: forming a display unit on a surface of a substrate, providing an encapsulation substrate, forming a sealant on the surface of the substrate, filling a filler interior to the sealant, disposing the encapsulation substrate on the substrate, differentially hardening the filler, and bonding the substrate and the encapsulation substrate using the sealant.

Figure 5A:
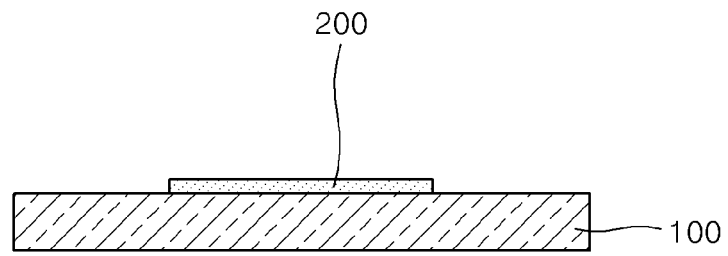
FIGS. 5A through 5F are cross-sectional views sequentially illustrating a method of manufacturing an organic light emitting display apparatus according to an embodiment of the present invention.

First, as illustrated in FIG. 5A, a display unit 200 is formed on a surface of a substrate 100. The substrate may be not only a glass substrate but also various plastic substrates such as acryl, and furthermore, a metal substrate. A buffer layer (not shown) may be included on the substrate according to necessity.

Next, an encapsulation substrate 300 is provided. The encapsulation substrate 300 may also be various plastic substrates such as acryl other than a glass substrate, or furthermore, a metal substrate.

Figure 5B:
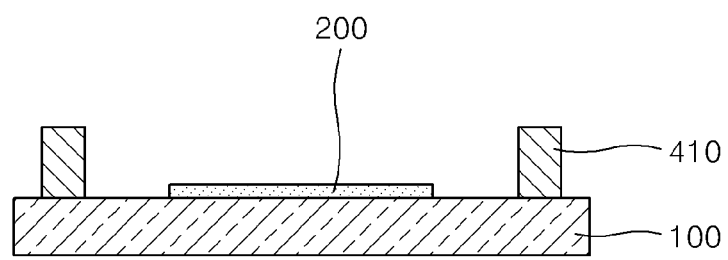

Next, as illustrated in FIG. 5B, a sealant 410 is formed on a surface of the substrate 100. The sealant 410 may be a generally used material such as a sealing glass frit.

Figure 5C:
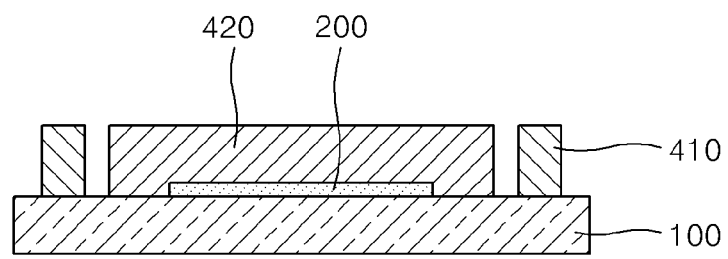

Next, as illustrated in FIG. 5C, a filler 420 is filled interior to the sealant 410 of the substrate 100. That is, the filler 420 is formed to fill a space between the substrate 100 and the encapsulation substrate 300.

Figure 5D:
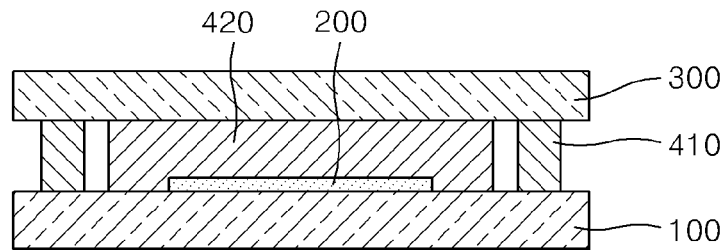

Next, as illustrated in FIG. 5D, an encapsulation substrate 300 is disposed above the substrate 100.

Figure 5E:
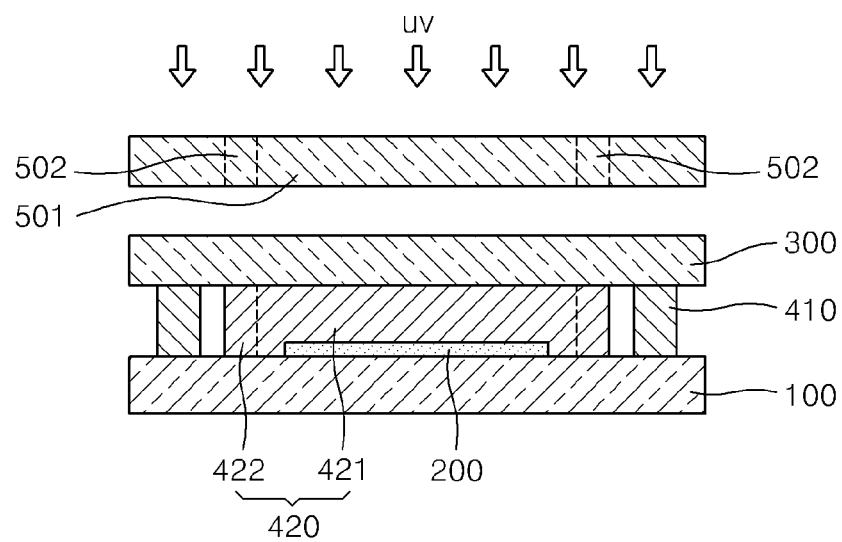

In this state, as illustrated in FIG. 5E, the filler 420 is differentially hardened.

In detail, the filler 420 filled in the space between the substrate 100 and the encapsulation substrate 300 includes a first region 421 and a second region 422. The first region 421 is a center portion of the filler 420, and the second region 422 is a boundary portion of the filler 420, that is, a region outside the first region 421 and adjacent to the sealant 410.

The filler 420 filled in the space between the substrate 100 and the encapsulation substrate 300 is differentially hardened using a UV mask 500 having different UV transmittivities for a center portion and a boundary portion of the UV mask 500. The UV transmittivity of the boundary portion 502 of the UV mask 500 is higher than that of the center portion 501 of the UV mask 500. Accordingly, the second region 422 of the filler 420 disposed below the boundary portion 502 of the UV mask 500 having high UV transmittivity is hardened more than the first region 421 of the filler 420 which is disposed below the center portion 501 of the UV mask 500 having low UV transmittivity. Since, more UV radiation is applied to the second region 422 of the filler 420 than the first region 421 of the filler 420, the hardness of the second region 422 becomes greater than that of the first region 421.

Thus, by differentially hardening the filler 420 using the UV mask 500 having different UV transmittivities in the center portion and the boundary portion of the UV mask 500, the second region 422 is hardened more than the first region 421 of the center portion, and the second region 422 functions as a dam for separating the sealant 410 and the filler 420. Accordingly, pollution of the sealant 410 by the filler 420 is prevented, and exfoliation defects can be reduced or prevented.

Figure 5F:
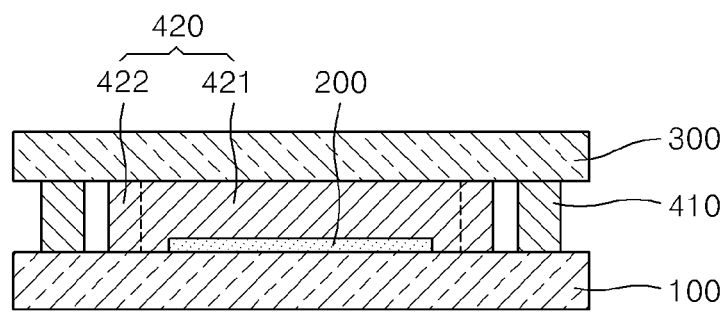

Next, as illustrated in FIG. 5F, the substrate 100 and the encapsulation substrate 300 are bonded using the sealant 410. That is, the sealant 410 is hardened by locally irradiating laser to the sealant 410 using a laser irradiator, thereby bonding the substrate 100 and the encapsulation substrate 300.

Meanwhile, after bonding the substrate 100 and the encapsulation substrate 300 using the sealant 410, a process of completely hardening the filler 420 may be further performed. When the filler 420 is completely hardened, the total intensity of the filler 420 is increased, and thus damage caused by an external shock can be better prevented.

As described above, according to at least one embodiment, by differentially hardening a filler, pollution of a sealant can be prevented and thus exfoliation defects can be reduced or prevented. While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display apparatus comprising:
   a substrate;
   a display unit formed on the substrate;
   an encapsulation substrate formed over the display unit;
   a sealant bonding the substrate and the encapsulation substrate; and
   a filler formed in the space defined by i) the substrate, ii) the sealant and iii) the encapsulation substrate,
   wherein the filler comprises a first region and a second region which have different levels of hardness, wherein the first and second regions are formed as a single layer, and wherein the first and second regions are formed as a continuous and integrated layer of a single material.

2. The organic light emitting display apparatus of claim 1, wherein the first region is closer to the display unit than the second region.

3. The organic light emitting display apparatus of claim 1, wherein the first region is a center portion of the filler, and the second region is a boundary portion of the filler.

4. The organic light emitting display apparatus of claim 1, wherein the second region has a greater level of hardness than that of the first region.

5. The organic light emitting display apparatus of claim 1, wherein the filler at least partially fills a space between the substrate and the encapsulation substrate.

6. The organic light emitting display apparatus of claim 5, wherein the filler covers the display unit.

7. The organic light emitting display apparatus of claim 1, wherein the second region is closer to the sealant than the first region.

8. The organic light emitting display apparatus of claim 1, wherein the filler contacts at least two of i) the substrate, ii) the display unit and iii) the encapsulation substrate.

9. The organic light emitting display apparatus of claim 1, wherein the first region is formed of a material having a first viscosity, and wherein the second region is formed of a material having a second viscosity which is greater than the first viscosity.

10. The organic light emitting display apparatus of claim 1, wherein the first region contacts the display unit, and wherein the second region does not contact the display unit.

11. The organic light emitting display apparatus of claim 1, wherein an opening is formed between the filler and the sealant.

12. An organic light emitting display apparatus comprising:
   a substrate;
   a display unit formed on the substrate;
   an encapsulation substrate formed above the display unit;
   a sealant bonding the substrate and the encapsulation substrate;
   a first filler covering the display unit, wherein the first filler has a first viscosity; and
   a second filler having a second viscosity which is greater than the first viscosity, wherein the second filler does not contact the display unit, wherein the second filler is closer to the sealant than the first filler, wherein the first and second fillers are formed as a single layer, and wherein the first and second fillers are formed as a continuous and integrated layer of a single material.

13. The organic light emitting display apparatus of claim 12, wherein an opening is formed between the second filler and the sealant.

* * * * *